United States Patent [19]

Sakamoto

[11] 4,403,156
[45] Sep. 6, 1983

[54] FREQUENCY CONVERSION CIRCUIT
[75] Inventor: Masaharu Sakamoto, Tokyo, Japan
[73] Assignee: Pioneer Electronic Corporation, Tokyo, Japan
[21] Appl. No.: 251,803
[22] Filed: Apr. 7, 1981
[51] Int. Cl.³ .................. H03B 5/24; H03B 21/00
[52] U.S. Cl. ................. 307/219.1; 307/520; 307/525; 307/529; 455/284
[58] Field of Search .......... 307/529, 475, 520, 525, 307/219.1; 330/252, 269, 69; 455/284, 283

[56] References Cited
U.S. PATENT DOCUMENTS

| | | | |
|---|---|---|---|
| 1,821,906 | 9/1931 | Cohen | 455/284 |
| 3,335,290 | 8/1967 | Fischman et al. | 307/529 |
| 3,517,214 | 6/1970 | Boegeman | 307/520 |
| 3,613,022 | 10/1971 | White | 307/520 |
| 3,628,168 | 12/1971 | Kobayashi | 330/252 |
| 3,872,393 | 3/1975 | Ohsawa | 330/252 |
| 4,345,502 | 8/1982 | Jahns | 330/269 |

Primary Examiner—John S. Heyman
Attorney, Agent, or Firm—Sughrue, Mion, Zinn, Macpeak, and Seas

[57] ABSTRACT

A frequency conversion circuit in which effects of odd order terms in the input and output characteristics of the active elements of the circuit, which otherwise would produce IM interference, are eliminated. A superposition signal composed of two signals of different frequencies is applied, in opposite phases, to control inputs of a differential pair of transistors. A common load is coupled to the differential pair with the odd order terms being cancelled at the common connection point of the differential pair. The common load is preferably a resonant circuit.

6 Claims, 3 Drawing Figures

FREQUENCY CONVERSION CIRCUIT

BACKGROUND OF THE INVENTION

The present invention relates to a frequency conversion circuit.

A frequency conversion circuit is an essential circuit in a receiver. In a frequency conversion circuit, the non-linear characteristic of an active element such as a transistor is utilized to convert two signals of other frequencies.

An example of a frequency conversion circuit is shown in FIG. 1. Two signals A and B respectively having different frequencies $f_A$ and $f_B$ are applied respectively through d.c. blocking capacitors $C_1$ and $C_2$ to the base of a bipolar transistor $Q_1$, which is a non-linear characteristic active element. An output signal C having a desired frequency $f_C$ is provided at the collector load of the transistor, specifically, a collector tuning circuit composed of a capacitor $C_3$ and a transformer $T_1$. A power source $E_1$ and a resistor $R_1$ provide base bias for the transistor $Q_1$.

The input and output characteristic of the transistor $Q_1$ can be represented by the following equation:

$$v_o = a_1 v_i + a_2 v_i^2 + a_3 v_i^3 + \quad (1)$$

where $a_1, a_2, a_3, \ldots$ are constants, $v_i$ is the input signal, and $v_o$ is the output signal.

The case where a desired signal of frequency $f_{d1}$ and interference signals of frequencies $f_1$ and $f_2$ which are close to $f_{d1}$, as shown in FIG. 2, are applied to the transistor circuit having the above-described construction will be considered. If it is assumed that the frequencies of the interference signals are: $f_1 = f_{d1} + \Delta f$ and $f_2 = f_{d1} + 2\Delta f$, respectively, then signals having frequencies $mf_1 \pm nf_2$ (where m and n are integers) are outputted. For $m=2$ and $n=1$, the following equation can be written:

$$2f_1 - f_2 = 2(f_{d1} + \Delta f) - (f_{d1} + 2\Delta f) = f_{d1}. \quad (2)$$

That is, because of the non-linear characteristic operation of the transistor, an interference signal having the same frequency $f_{d1}$ as that of the desired signal is produced from the two interference signals $f_1$ and $f_2$.

If $m = -1$ and $n = 2$, the following equation can be written:

$$2f_2 - f_1 = f_{d1} + 3 \cdot \Delta f = f_{d2}. \quad (3)$$

Thus, in receiving the second desired signal $f_{d2}$, an interference signal having the same frequency as that of the desired signal is produced. The production of intermodulation (IM) interference signals in the cases of $m=2$, $n=1$ and $m=-1$, $n=2$ is attributed to the odd order terms of equation (1).

In the circuit of FIG. 1, the collector tuning circuit ($C_3$ and $T_1$) operates to select one of the signal frequencies $f_A + f_B$ corresponding to the second order term in equation (1).

The circuit of FIG. 1 is disadvantageous in that, upon reception of the above-described interference signals $f_1$ and $f_2$, the desired signal $f_{d1} = f_A \pm f_B$ is subjected to IM (intermodulation) interference. In the conventional circuit, as long as the transistor $Q_1$ has an input and output characteristic including the aforementioned odd order terms, the occurrence of IM (intermodulation) interference is unavoidable.

SUMMARY OF THE INVENTION

Accordingly, an object of the present invention is to provide a frequency conversion circuit in which the effects of the odd order terms in the input and output characteristic of non-linear active elements such as transistors which results in IM interference in frequency conversion are eliminated.

In accordance with this and other objects, the invention provides a frequency conversion circuit in which a superposition signal composed of signals of two different frequencies is applied, in opposite phases, to the control inputs of a differential pair of active elements. A frequency-converted signal is obtained from a common load provided for the differential outputs of the active elements which is free of IM interference.

More specifically, the invention provides a frequency conversion circuit including a pair of active elements, means for applying in opposite phases a superposition signal composed of signals of first and second frequencies to respective control inputs of the active elements, and a common load connected to the differential outputs of the active elements across which is outputted a frequency-converted signal corresponding to the first and second signals. The active elements may be bipolar transistors in which case the control elements are bases and the differential outputs are collectors of the transistors, respectively. Otherwise, the active elements may be field-effect transistors in which case the control inputs are gate electrodes and the differential outputs are drain electrodes. Preferably, the means for applying the superposition signal is a transformer with the superposition signals applied to the primary. A center-tapped secondary winding with the center tap grounded is coupled, respectively, at the two ends to the inputs of the differential active elements. Also preferably, the common load is a resonant circuit, the coil of which is a transformer with the output signal being produced across the secondary of the transformer.

DESCRIPTION OF THE PREFERRED EMBODIMENTS

Figure 3:
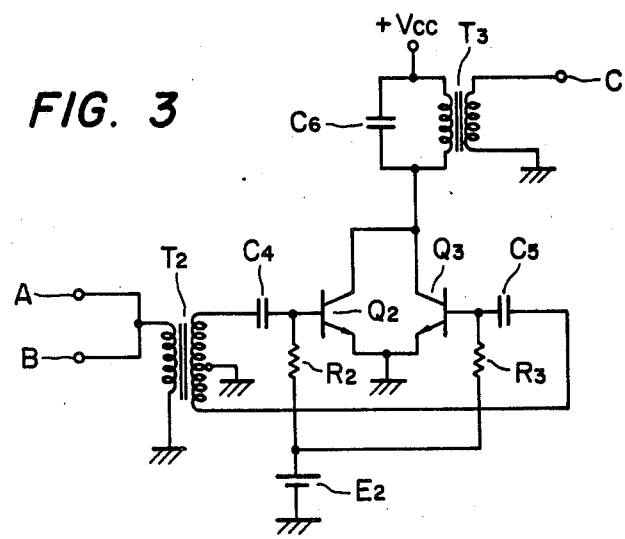
FIG. 3 is a circuit diagram of a preferred embodiment of a frequency conversion circuit according to the invention.

The invention will be described with reference to FIG. 3. FIG. 3 is a circuit diagram of a preferred embodiment of a frequency conversion circuit according to the invention. Two signals A and B of different frequency are applied superposed to the primary winding of an input transformer $T_2$. The midpoint of the secondary winding of the input transformer $T_2$ is grounded. Opposite phase superposition signals (A+B) are developed at the ends of the secondary winding. These signals, $\pm(A+B)$, are applied through capacitors $C_4$ and $C_5$ to the bases of differential bipolar transistors $Q_2$ and $Q_3$, respectively. The emitters of the transistors $Q_2$ and $Q_3$ are connected to a reference potential point, here, ground. The coupled collector outputs of the transistors are applied to a common load, namely, an output tuning circuit composed of a capacitor $C_6$ and a transformer $T_3$, which is adapted to select a desired signal C of the desired frequency. Bias voltages are applied to the bases of the transistors $Q_2$ and $Q_3$ through a voltage source $E_2$ and resistors $R_2$ and $R_3$, respectively.

It is assumed that, in the circuit in FIG. 3, the differential transistors $Q_2$ and $Q_3$ paired as described above are active elements having the same characteristics, specifically, having the same input and output characteristic represented by equation (1). Then, since the inputs are opposite in phase to one another, the collector outputs $\Delta I_1$ and $\Delta I_2$ of the two transistors attributed to the third order term of $(a_3 v_i^3)$ are obtained as functions of $\pm(A+B)^3$, as a result of which those portions of the collector outputs cancel each other at the collector common connection point due to the 180° phase difference. The same is true for the fifth and higher odd order terms.

On the other hand, the collector outputs $\Delta I_1'$ and $\Delta I_2'$ of the transistors attributed to the second order term $(a_2 v_i^2)$ and higher even order terms are obtained as functions of $(A+B)^2$, even if the two inputs $\pm(A+B)$ are opposite in phase. Therefore, these portions of the outputs are summed at the collector common connection point and thus doubling the output for the terms.

Figure 1:
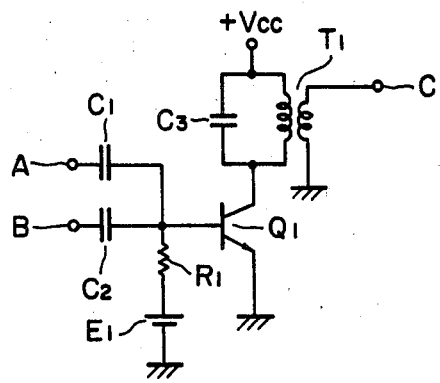
FIG. 1 is a circuit diagram showing an example of a conventional frequency conversion circuit.
Figure 2:
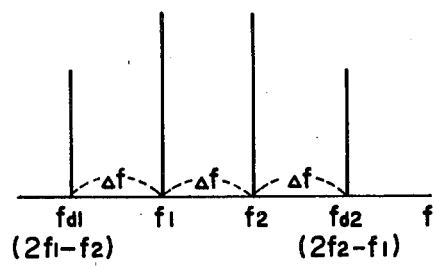
FIG. 2 is a diagram for a description of intermodulation interference.

As is apparent from the above description, the outputs of the transistors due to the odd order terms cancel each other by the operation of the differential pair of transistors. Thus, the production of IM interference due to the odd order terms is eliminated. On the other hand, a signal which is a summation or difference of two input signals A and B is twice as high in level as that in the case of the circuit of FIG. 1.

In the above-described embodiment, NPN bipolar transistors are employed as the active elements. However, the active elements may be PNP bipolar transistors or field-effect transistors. In the latter case, the circuit should be designed so that inputs $\pm(A+B)$ of opposite phase are applied to the gates of the two transistors and the drain outputs of the two transistors are connected to the common load.

As is clear from the above description, in the frequency conversion circuit according to the invention, the occurrence of IM interference is prevented and the conversion gain is about twice (+6 dB) as high as that of a conventional frequency conversion circuit.

What is claimed is:

1. A frequency conversion circuit comprising:
    a differential pair of active semiconductive elements having outputs coupled together;
    means for biasing said active elements only into non-linear operating regions thereof;
    means for applying, in opposite phases, a superposition signal composed of signals of first and second frequencies to respective control inputs of said active elements; and
    a common load for differential outputs of said active elements, a frequency-converted signal of said first and second signals produced by non-linear operation of said active elements being present across said load.

2. The circuit as claimed in claim 1 wherein said active elements comprise bipolar transistors, and said control inputs and said differential outputs are bases and collectors of said bipolar transistors, respectively.

3. The circuit as claimed in claim 1 wherein said active elements comprises field-effect transistors, and said control inputs and said differential outputs are gate electrodes and drain electrodes of said field-effect transistors.

4. The circuit as claimed in any of claims 1–3 wherein said common load comprises a resonant circuit having a resonant frequency substantially equal to the frequency of a desired signal.

5. The frequency conversion circuit of any of claims 1–3 wherein said means for applying said superposition signal comprises a transformer having a primary winding to which said first and second signals are coupled and a center-tapped secondary winding, ends of said secondary winding being coupled to said respective control inputs of said active elements.

6. A frequency conversion circuit comprising:
    a first transformer, a superposition signal composed of signals of first and second frequencies being coupled to a first terminal of a primary winding of said first transformer, a second terminal of said primary winding being coupled to a reference voltage point, said first transformer having a center-tapped secondary winding, a center tap of said secondary winding being coupled to said reference voltage point;
    first and second bipolar transistors, said first and second bipolar transistors having emitters coupled together and coupled to said reference voltage point and collectors coupled together;
    first and second capacitors coupling, respectively, first and second ends of said secondary winding of said first transformer to bases of said first and second transistors;
    means for supplying bias to said bases of said first and second transistors;
    a third capacitor and a second transformer, said third capacitor being coupled across a first winding of said second transformer, a first terminal of said third capacitor being coupled to said collectors of said first and second transistors and a second terminal of said third capacitor being coupled to a voltage source for biasing said transistors only in their non-linear region, said second transformer having a secondary winding, a first terminal of said second winding being coupled to said reference voltage point, and an output signal being produced at a second terminal of said second winding.

* * * * *

UNITED STATES PATENT AND TRADEMARK OFFICE
CERTIFICATE OF CORRECTION

PATENT NO. : 4403156

DATED : September 6, 1983

INVENTOR(S) Masaharu Sakamoto

It is certified that error appears in the above-identified patent and that said Letters Patent is hereby corrected as shown below:

On page 1 of the patent, the following foreign priority data should appear:

[ 30 ] Foreign Application Priority Data
April 10, 1980    Japan.......55-47249

Signed and Sealed this

Sixth Day of March 1984

[SEAL]

Attest:

GERALD J. MOSSINGHOFF

Attesting Officer

Commissioner of Patents and Trademarks